United States Patent
Kumai et al.

(10) Patent No.: US 6,537,627 B2
(45) Date of Patent: Mar. 25, 2003

(54) PRECISION PRODUCT CONTAINER (75) Inventors: Sadao Kumai, Tokyo (JP); Tsutomu Suzuki, Iwatsuki (JP); Tatsuaki Hirohata, Fukushima-ken (JP); Takehito Ushiki, Fukushima-ken (JP); Masaaki Miyamoto, Kitakyushu (JP); Hidemi Nakanishi, Kitakyushu (JP); Yoshitaka Shiraishi, Kitakyushu (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/322,106

(22) Filed: May 28, 1999

(65) Prior Publication Data

US 2002/0132073 A1 Sep. 19, 2002

(30) Foreign Application Priority Data

Jun. 2, 1998 (JP) .......................................... 10-153001

(51) Int. Cl.⁷ ............................................. C08G 64/22
(52) U.S. Cl. ..................... 428/35.7; 428/36.6; 524/109; 524/114; 525/463
(58) Field of Search ................................ 524/109, 114; 525/463; 428/35.7, 36.6

(56) References Cited

U.S. PATENT DOCUMENTS 5,514,767 A * 5/1996 Sakashita et al. ........... 528/198
5,827,584 A * 10/1998 Akao et al. ................. 428/35.7
5,986,016 A * 11/1999 Puyenbroek et al. ........ 525/420

FOREIGN PATENT DOCUMENTS

| JP | 54-32021 | 10/1979 |
|----|----------|---------|
| JP | 56-88459 | 7/1981 |
| JP | 62-297320 | 12/1987 |
| JP | 62-297321 | 12/1987 |
| JP | 7-242286 | 9/1995 |
| JP | 10-211686 | 8/1998 |
| JP | 10-226724 | 8/1998 |

OTHER PUBLICATIONS

Pages from U.S. patent application Ser. No. 08/987,608, filed on Dec. 9, 1976; p. 15 and the claims thereof (pp. 23–25).

* cited by examiner

*Primary Examiner*—Sandra M. Nolan
(74) *Attorney, Agent, or Firm*—David C. Conlin; John B. Alexander; Edwards & Angell, LLP

(57) ABSTRACT

A precision product container of the present invention comprises a resin composition as a base material, which comprises a polycarbonate resin and an epoxy compound. Such precision product container can remarkably prevent products contained therein from being contaminated by chlorine and is suitable as a container for a precision product which is free from operational errors of the precision product contained therein when this product is subsequently assembled or processed.

2 Claims, 1 Drawing Sheet

FIG.1

PRECISION PRODUCT CONTAINER

BACKGROUND OF THE INVENTION

The present invention relates to a precision product container comprising a polycarbonate resin composition as a base material, and more particularly, to a precision product container for containing (inclusive of transporting, storing, and transferring between respective steps) precision products such as electrical parts or electronic parts which tend to be severely damaged even by a trace amount of impurities or contaminants (e.g., various wafers for semiconductors such as unprocessed wafers, discrete wafers, semi-processed wafers before being finished into circuits, patterned wafers, dicing wafers or the like; semiconductor materials such as IC chips or the like; various masks such as photo masks or the like; lead frames; disc substrates such as aluminum discs or the like; various display devices such as liquid crystal panels or plasma display panels; or the like).

Polycarbonate resin containers have been widely used, because these containers are transparent or translucent so that the contents to be contained are visible from outside, and can exhibit excellent properties such as impact resistance. In recent years, kinds of products to be contained in such containers tend to spread widely, so that these containers have been applied to the field of precision products which are required to be strictly free from contamination, such as electrical parts or electronic parts or devices.

However, in certain kinds of precision products such as wafers or semiconductor materials such as IC chips, because of high performance thereof, the precision products which are contained in these containers, sometimes suffer from operational errors when subsequently assembled or processed.

As a result of the analysis of these errors, it has been recognized that chlorine (Cl) ions volatilized from the polycarbonate resin container adversely affect the performance of the precision products to be contained.

In Japanese Patent Application Laid-Open Nos. 62-297320(1987) and 62-297321(1987) which are directed to a method of reducing the amount of chlorine in order to prevent the corrosion of a metal mold used upon molding the polycarbonate resin, it has been described that since phosgene contains as impurities carbon tetrachloride having a boiling point higher than that of phosgene, the content of carbon tetrachloride in phosgene is to be reduced to not more than a predetermined amount in order to prevent the generation of hydrogen chloride by heating upon molding the polycarbonate resin.

On the other hand, there have been hitherto reported many polycarbonate resins to which an epoxy compound is added. For example, in Japanese Patent Application Laid-Open (KOKAI) Nos. (1979), 56-88459(1981), 56-32228(1981), 57-37174(1982) and 58-17224(1983), it has been described that an epoxy compound is added together with various heat stabilizers in order to enhance a heat stability of polycarbonate resins. Further, in Japanese Patent Application Laid-Open (KOKAI) No. 52-104564(1977) and Japanese Patent Publication (KOKOKU) No. 60-17224(1985), it has been described that a halogen-containing compound and an epoxy compound coexist in polycarbonate resins. Therefore, the addition of an epoxy compound to polycarbonate resins is widely known in the arts. In addition, in the case of fire-retardant polycarbonate resin composition containing a halogen-containing compound, it is known that an epoxy compound is used for capturing halogen atoms which are expected to be generated from the heat-unstable halogen-containing compound.

However, it has never been known to use the above-mentioned resin compositions for precision product containers. The reason therefor is as follows. That is, there has been a predominant tendency that the content of impurities which are expected to be generated from precision product containers, is reduced to a level as small as possible, so that the addition of additives such as the epoxy compound to the precision product containers has been avoided.

As a result of the present inventors' earnest studies concerning chlorine (Cl) contained in polycarbonate resin molded products, it has been found that by using a polycarbonate resin composition into which an epoxy compound having a functional group capable of capturing chlorine is kneaded in an amount corresponding to the content of chlorine therein, there can be obtained a precision product container in which the chlorine normally volatilized can be retained in polycarbonate resin composition without being volatilized therefrom, and the epoxy compound added does not adversely affect products contained therein.

More specifically, it has been found that in the case where carbon tetrachloride remains in the polycarbonate resin or in the case where a chloroformate group produced in the course of the polycarbonate resin production process according to a two-phase interfacial method still remains in the polycarbonate resin, there tends to be caused such a phenomenon that hydrogen chloride (HCl) is generated upon melt-molding of the polycarbonate resin; or that when a specific portion of diphenols is chlorinated in any form by chlorine which remains as an impurity in phosgene during the reaction of an aqueous solution of diphenol alkali metal salt with phosgene at an initial stage of the polycarbonate resin production process, and the chlorinated portions remains unchanged up to the final step, chlorine is gradually volatilized from the resultant polycarbonate resin molded product while allowing the product to stand in an ambient condition (in this case, the chlorine is detected in the form of chlorine ions), but the phenomenon of volatilizing chlorine in any form from the polycarbonate resin can be inhibited by adding thereto an epoxy compound in an amount corresponding to those of these chlorine compounds. The present invention has been achieved on the basis of these findings.

SUMMARY OF THE INVENTION

It is an object of the present invention to provide a container for a precision product which is free from operational errors of the precision product contained therein when this product is subsequently assembled or processed.

In a first aspect of the present invention, there is provided a precision product container comprising a resin composition as a base material, which comprises a polycarbonate resin and an epoxy compound.

In a second aspect of the present invention, there is provided a precision product container comprising a resin composition as a base material, which comprises a polycarbonate resin and an epoxy compound, the amount of chlorine (Cl) ions volatilized from the resin composition to a gas phase within a glass tube, being not more than 15 ppb when the resin composition previously dried until the percentage of water absorption thereof reaches not more than 0.05% by weight, is charged in the glass tube, and the glass tube is sealed under a pressure of not more than 1 mmHg heated to 280° C. for 30 minutes, cooled to 23° C. and then allowed to stand at an ordinary temperature (23° C.) for 3 days.

In a third aspect of the present invention, there is provided a precision product container comprising a resin composition as a base material which contains a polycarbonate resin and an epoxy compound, the amount of chlorine (Cl) ions volatilized from the polycarbonate resin to a gas phase within a glass tube, being not more than 30 ppb when the polycarbonate resin previously dried until the percentage of water absorption thereof reaches not more than 0.05% by weight, is charged in the glass tube, and the glass tube is sealed under a pressure of not more than 1 mmHg, heated to 280° C. for 30 minutes, cooled to 23° C. and then allowed to stand at an ordinary temperature (23° C.) for 3 days, and the amount of the epoxy compound being 1 ppm to 1,000 ppm.

Thus, by using a polycarbonate resin composition which contains an epoxy compound and inhibits the volatilization of chlorine therefrom as a base material for a precision product container (hereinafter referred to merely as "container"), it is possible to prevent precision products contained in the container from being contaminated by halogen impurities and additives.

DETAILED DESCRIPTION OF THE INVENTION

The amount of chlorine ions volatilized from the precision product container according to the present invention, is usually not more than 15 ppb (part per billion), preferably not more than 10 ppb, more preferably not more than 5 ppb. Such a precision product container according to the present invention can be produced by molding a resin composition containing an epoxy compound as a base material in the form of a container by various molding methods such as an injection-molding method, an extrusion-molding method, an inflation-molding method, a blow-molding method, a differential pressure-molding method, a vacuum-molding method, an air pressure-molding method or the like. Incidentally, in the present invention, the term of "volatilized chlorine (Cl) ions" or "volatile chlorine (Cl)" means chlorine ions which are volatilized into a gas phase portion of a glass tube from the resin composition, when the resin composition which is previously dried until a predetermined percentage of water absorption thereof is reached (in the present invention, dried to a percentage of water absorption of not more than 0.05% by weight), is charged in the glass tube, and the glass tube is sealed under a pressure of not more than 1 mmHg, heated at a predetermined temperature for a predetermined time (at 280° C. for 30 minutes in the present invention), cooled to 23° C. and then allowed to stand at an ordinary temperature (23° C.) for 3 days. More specifically, such "volatilized Cl ions" or "volatile Cl" can be measured according to the method described as "measurement of volatile Cl" in Examples hereinafter.

Figure 1:
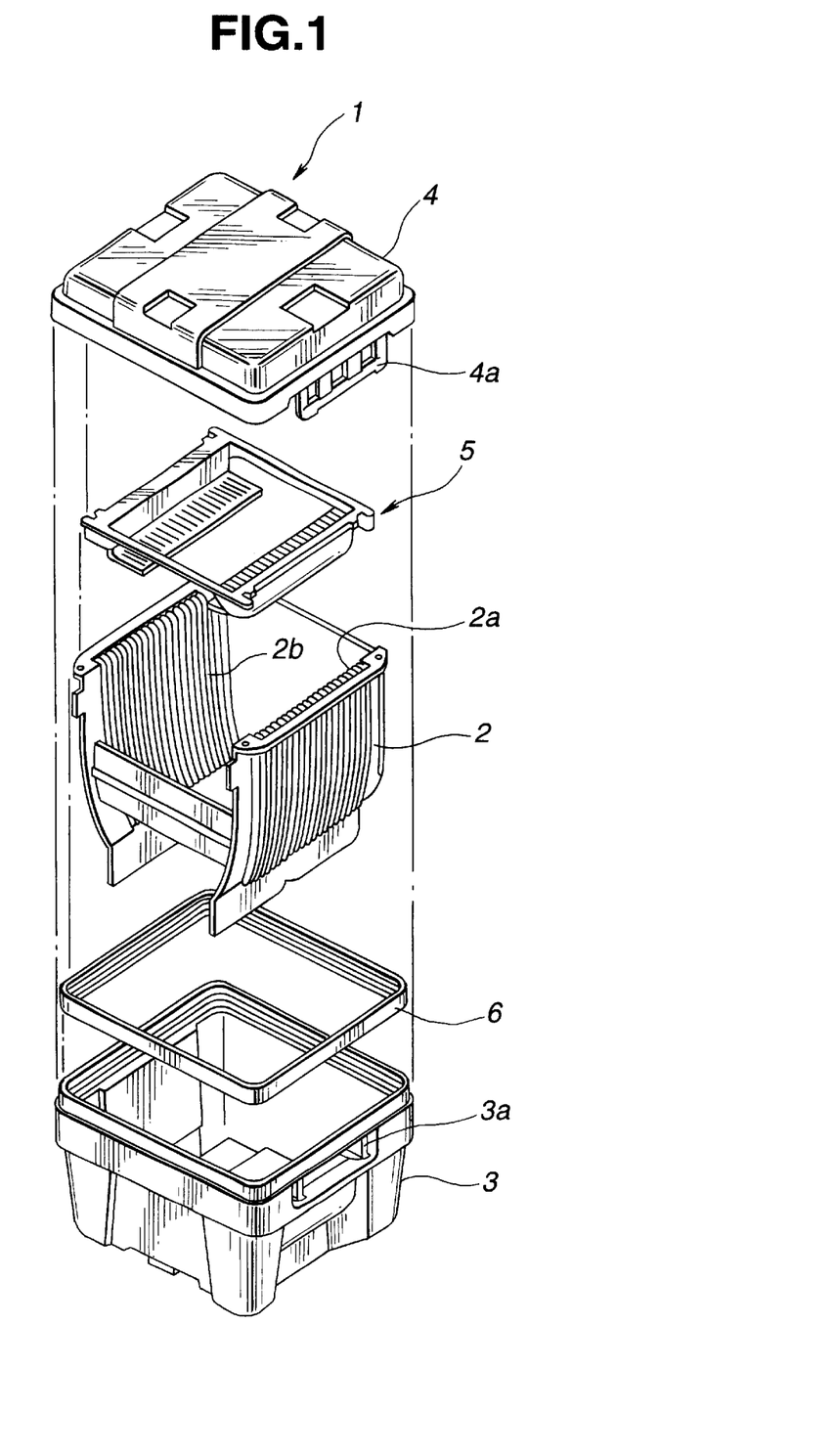
FIG. 1 is a perspective view showing an assembling step of a wafer-containing container according to the present invention.

Referring to FIG. 1, there is shown an example of the precision product container according to the present invention. In FIG. 1, reference numeral 1 denotes the precision product container; 2 is a wafer carrier; 2a is a rib; 2b is a groove; 3 is a container body; 4 is a lid; 5 is a wafer retainer; and 6 is a gasket. The wafers are respectively inserted one by one into the grooves 2b, 2b of the wafer carrier 2 in a spaced relation with each other. Five to forty wafers may be contained in each container. The lid 4 is mounted onto the container body 3 by interlocking an engaged member 4a and an engaging member 3a respectively provided on the lid 4 and the container body 3 with each other through the packing 6.

Production of Polycarbonate Resin

The process for producing the polycarbonate resin having a less amount of volatile Cl as a base material of the resin composition according to the present invention, is not particularly restricted. The production of the polycarbonate resin can be conducted by the same methods as conventionally used for producing resins having carbonate bonds, except for using phosgene wherein the concentration of chlorine is usually not more than 1,000 ppb, preferably not more than 500 ppb, more preferably not more than 100 ppb.

As the conventional methods for producing polycarbonate resins, there may be exemplified:

1) A method of reacting phosgene with diphenol under interfacial polycondensation conditions or under solution polymerization conditions;

2) A method of reacting a CO source with phenol to produce diphenyl carbonate, and then reacting the obtained diphenyl carbonate with diphenol under melt-condensation conditions.

As a typical example of the above method 2), there may be exemplified a method of increasing a molecular weight of polycarbonate by ester exchange reaction of purified diphenyl carbonate and diphenol under the condition of melting thereof (at a temperature of about 285° C.) while distilling off phenol under a high vacuum condition (not more than 50 mmHg; $\leqq$50 mmHg). At this time, various types of polycondensation catalysts can be used in the above method. The phenol distilled can be recovered and reused.

(1) Raw Materials (a) Diphenol

As the preferred diphenol usually used in the production process of polycarbonate resins, there may be exemplified those compounds represented by the general formula: HO—Z—OH, wherein Z is at least one aromatic nucleus. In the above general formula, hydrogen atoms bonded to the aromatic nucleus may be substituted with chlorine, bromine, an aliphatic group or an alicyclic group. When Z represents a plurality of aromatic nuclei, the respective aromatic nuclei may have different substituents, and may be bonded with each other through cross-linking groups. As the cross-linking groups, there may be exemplified an aliphatic group, an alicyclic group, a hetero atom or the combination thereof.

Specific examples of the diphenols may include hydroquinone, resorcin, dihydroxy diphenol, bis(hydroxyphenyl)alkane, bis(hydroxyphenyl)cycloalkane, bis(hydroxyphenyl)sulfide, bis(hydroxyphenyl)ethers, bis(hydroxyphenyl)ketone, bis(hydroxyphenyl)sulfone, bis(hydroxyphenyl)sulfoxide, bis(hydroxyphenyl)dialkyl benzene, derivatives thereof having alkyl or halogen substituents bonded to the aromatic nucleus, or the like. These diphenols may be used singly or in the form of a mixture of any two or more thereof.

The suitable diphenols are described, for example, in the specifications of U.S. Pat. Nos. 4,982,014, 3,028,365, 2,999,835, 3,148,172, 3,275,601, 2,991,273, 3,271,367, 3,062,781, 2,970,131 and 2,999,846, German Patent Offenlegungsschrift Nos. 1,570,703, 2,063,050, 2,063,052 and 2,211,956, and French Patent No. 1,561,518.

Examples of the more preferred diphenols may include 2,2-bis(4-hydroxyphenyl)propane, 2,2-bis(3,5-dimethyl-4-hydroxyphenyl)propane, 1,1-bis(4-hydroxyphenyl)cyclohexane and 1,1-bis(4-hydroxyphenyl)-3,3,5-trimethyl cyclohexane.

(b) Phosgene

The phosgene used for the production of polycarbonate resins, may be in the form of either liquid or gas. It is preferred that the concentration of $Cl_2$ contained as impurities in the raw phosgene be low, because the amount of epoxy compounds added to the polycarbonate resins can be reduced. The concentration of $Cl_2$ contained in the phosgene is usually not more than 1,000 ppb, preferably not more than 500 ppb, more preferably not more than 100 ppb, still more preferably 0 to 100 ppb.

As the method of removing $Cl_2$ from the raw phosgene, there may be exemplified a method of adsorbing $Cl_2$ by activated carbon or the like (adsorption-removing method), a method of distilling off $Cl_2$ using the difference in boiling point between phosgene and $Cl_2$ (distillation-removing method), or the like. In the present invention, any of these methods can be used for removing $Cl_2$ from the raw phosgene. However, in the case of the distillation-removing method, since the amount of $Cl_2$ removed at each distillation stage is extremely small, the method requires a considerably large number of distillation stages and is, therefore, disadvantageous. From this standpoint, the adsorption-removing method using activated carbon is preferable.

As the activated carbons used in the adsorption-removing method, there may be exemplified activated carbons for acidic gases, activated carbons for basic gases, activated carbons for general gases, and the like. Among them, the activated carbons for acidic gases which can exhibit the following properties, are preferably used.

Particle size: 2 to 60 mesh (residue on a 60 mesh sieve, which is passed through a 2 mesh sieve), preferably 4 to 6 mesh (residue on a 6 mesh sieve, which is passed through a 4 mesh sieve);

True density: 1.9 to 2.2 g/cc, preferably 2.0 to 2.1 g/cc;

Percentage of void: 33 to 55%, preferably 40 to 45%;

Specific surface area: 700 to 1,500 $m^2/g$, preferably 1,150 to 1,250 $m^2/g$;

Pore volume: 0.5 to 1.1 cc/g, preferably 0.80 to 0.90 cc/g; and

Average pore diameter: 12 to 40 Å, preferably 12 to 20 Å.

In addition, from the standpoint of temperature control, liquid phosgene is preferred. In particular, in the case of carrying out the adsorption-removing method, the liquid phosgene is advantageous.

The adsorption-removing method is not particularly restricted. For example, there may be used such a method of passing liquefied phosgene through an activated carbon-filled tower at a space velocity (SV) of 5 to 20 and at a temperature of 0 to 5° C. while maintaining the liquid state.

When the liquid phosgene is introduced into the reaction system while maintaining the liquid state, the reaction pressure is appropriately selected such that the phosgene can be maintained in a liquid state at each reaction temperature.

The amount of phosgene used varies depending upon reaction conditions, especially the reaction temperature and the concentration of diphenol alkali metal salt in a water phase, but is usually 1 to 2 moles, preferably 1.05 to 1.5 moles based on one mole of diphenol. When the amount of phosgene used is too large, a large amount of unreacted phosgene may be generated, so that the unit is extremely deteriorated. On the other hand, when the amount of phosgene used is too small, the amount of CO groups may be deficient, so that the molecular weight of the resin produced cannot be increased to an appropriate level.

(c) Others

Any optional chain stopper and/or a branching agent may be added to the reaction system, if required.

As suitable chain stoppers, there may be exemplified various monophenols, e.g., phenol, alkyl phenols having $C_1$ to $C_{10}$ alkyl groups such as p-tert-butyl phenol or p-cresol, halogenated phenols such as p-chlorophenol or 2,4,6-tribromophenol, or the like. Among these compounds, phenol, cumyl phenol, iso-octyl phenol and p-tert-butyl phenol are preferably used as the chain stopper.

The amount of the chain stopper used varies depending upon the molecular weight of an aimed condensate, but is usually 0.5 to 10% by weight based on the weight of diphenol in the water phase.

The branching agent used may be appropriately selected from various compounds having three or more functional groups. As suitable branching agents, there may be exemplified compounds having three or more phenolic hydroxy groups, such as 2,4-bis(4-hydroxyphenyl-isopropyl)phenol, 2,6-bis(2'-hydroxy-5'-methylbenzyl)-4-methyl phenol, 2-(4-hydroxyphenyl)-2-(2,4-hydroxyphenyl)propane or 1,4-bis (4,4'-dihydroxytriphenylmethyl)benzene, compounds having three functional groups, such as 2,4-dihydroxy benzoic acid, trimesic acid, cyanuric chloride, bis(4-hydroxyphenyl)-2-oxo-2,3-dihydroxy indole or 3,3-bis(4-hydroxy-3-methylphenyl)-2-oxo-2,3-dihydroxy indole, or the like. Among these branching agents, those compounds having three or more phenolic hydroxy groups are preferred. The amount of the branching agent used varies depending upon an aimed branching degree, but is usually 0.05 to 2 mol % based on the mole of the diphenol in the water phase.

(2) Polycondensation Reaction (a) Reaction Conditions (i) Solvent

The organic phase used includes any optional inert organic solvent which is capable of dissolving reactants and reaction products such as phosgene, carbonate oligomers, polycarbonate resins or the like, and incapable of dissolving water (i.e., immiscible with water so as not to form a solution therewith).

Typical examples of the inert organic solvents may include aliphatic hydrocarbons such as hexane and n-heptane; chlorinated aliphatic hydrocarbons such as methylene chloride, chloroform, carbon tetrachloride, dichloroethane, trichloroethane, tetrachloroethane, dichloropropane and 1,2-dichloroethylene; aromatic hydrocarbons such as benzene, toluene and xylene, chlorinated aromatic hydrocarbons such as chlorobenzene, o-dichlorobenzene and chlorotoluene; substituted aromatic hydrocarbons such as nitrobenzene and acetophenone; or the like. Among these inert organic solvents, chlorinated hydrocarbons, e.g., methylene chloride or chlorobenzene are preferably used.

These inert organic solvents may be used singly or in the form of a mixture of any two or more thereof.

However, in the case where chlorobenzene is used solely, it is necessary that a higher temperature is used in the reaction and washing steps in order to obtain a technically effective concentration of polycarbonate resins in chlorobenzene.

Further, as a mixed solvent suitable for the production of industrially important polycarbonate resins mainly composed of 2,2-bis(4-hydroxyphenyl)propane, there is known a mixture of methylene chloride and toluene. This solvent may also be used in the method according to the present invention.

The water phase is composed of at least three components including water, diphenol and alkali metal hydroxide. In the water phase, diphenol is reacted with alkali metal hydroxide such as sodium hydroxide or potassium hydroxide, thereby producing a water-soluble alkali metal salt. As a matter of course, it is preferred that all of the above-mentioned three components are previously mixed together to prepare a homogeneous aqueous solution as a water phase before contacting with the organic phase. However, if required, a part or a whole of the three components may be added and mixed in the reaction system when contacted with the organic phase.

(ii) Mixing Ratio

The molar ratio of diphenol to alkali metal hydroxide in the water phase, is preferably 1:1.8 to 1:3.5, more preferably 1:2 to 1:3.2. The temperature used upon the production of such an aqueous solution, is usually not less than 20° C., preferably 30 to 40° C. However, when the temperature is too high, there is disadvantageously caused the oxidation of diphenol. Therefore, it is preferred that the production of the aqueous solution be conducted at a necessary minimum temperature in a nitrogen atmosphere or by adding a small amount of a reducing agent such as hydrosulfite.

(b) Catalyst

In the production of polycarbonate resins, a condensation catalyst may be supplied to the reaction system upon the contact between the water phase and the organic phase in advance of contacting with phosgene. If required, the condensation catalyst may be supplied simultaneously with the contact with phosgene.

The condensation catalyst may be optionally selected from many polycondensation catalysts ordinarily used in a two-phase interfacial condensation method. Among these catalysts, trialkyl amines, N-ethyl pyrrolidone, N-ethyl piperidine, N-ethyl morpholine, N-isopropyl piperidine and N-isopropyl morpholine are preferred. Among them, triethyl amine and N-ethyl piperidine are more preferred.

(c) Production of Oligomer

The suitable concentration of oligomer in the organic phase when obtaining the oligomer, is such a range that the obtained oligomer can be dissolved in the organic phase. More specifically, the concentration of the oligomer in the organic phase is about 10 to about 40% by weight. In addition, the volume ratio of the organic phase to the aqueous solution of diphenol alkali metal hydroxide, i.e., the water phase, is preferably 0.2:1 to 1.0:1. The average molecular weight ($M_v$) of the oligomer produced under such condensation conditions, is usually about 500 to about 10,000, preferably 1,600 to 4,500, though not limited to these values.

(d) Polycondensation Reaction

The thus obtained oligomer is then subjected to polycondensation reaction under ordinary reaction conditions, thereby producing a high-molecular weight polycarbonate resin. In the preferred embodiment of the present invention, the organic phase in which the oligomer is dissolved, is separated from the water phase, and the concentration of the oligomer in the organic phase may be adjusted, if required, by adding an additional amount of the above-mentioned inert organic solvent to the organic phase separated.

That is, the amount of the inert organic solvent in the organic phase is adjusted such that the concentration of the polycarbonate resin produced by the above polycondensation reaction, lies in the range of 5 to 30% by weight. Thereafter, a fresh water phase containing water and alkali metal hydroxide is added again to the thus adjusted organic phase. Further, a condensation catalyst, preferably the above-mentioned condensation catalyst, is added to the mixed phase in order to arrange the polycondensation reaction conditions, thereby completing the aimed polycondensation reaction according to the two-phase interfacial condensation method. The volume ratio of the organic phase to the water phase upon the polycondensation reaction, is preferably about 1:0.2 to 1:1.

After completion of the polycondensation reaction, the obtained organic phase is washed with an alkali solution such as a NaOH solution until the concentration of residual chloroformate group reaches not more than 0.01 μeq/g. Thereafter, the organic phase is further washed until no electrolyte exists therein. Finally, the inert organic solvent is appropriately removed from the organic phase, thereby separating the polycarbonate resin.

Polycarbonate Resin

The thus obtained polycarbonate resin has an average molecular weight ($M_v$) of usually about 10,000 to about 100,000.

Here, the average molecular weight ($M_v$) means the value calculated from the specific viscosity ($\eta sp$) of the oligomer or the polycarbonate at the concentration (C) measured at 20° C. by using a 0.6 g/dl methylene chloride solution according to the following formulae (1) and (2):

$$\eta sp/C=[\eta](1+0.28\eta sp) \qquad (1)$$

$$[\eta]=1.23\times10^{-5}M_v^{0.83} \qquad (2)$$

The amount of volatile chlorine generated from the thus obtained polycarbonate resin (amount of Cl volatilized based on the polymer; ppb), can be reduced to usually not more than 30 ppb, preferably not more than 20 ppb, more preferably not more than 15 ppb by the combination of suitable production conditions. Further, in the case where the epoxy compound is added to the polycarbonate resin, the amount of the epoxy compound added which is required in order to reduce the amount of volatile chlorine generated from the thus obtained polycarbonate resin composition to not more than 15 ppb, is as small as a range of 1 ppm to 1,000 ppm.

Epoxy Compound

As the epoxy compound added, substantially all compounds having epoxy groups may be used as long as they can react with acidic halogen, from the standpoint of the above-mentioned properties. However, the use of epoxy compounds which are readily volatilized at a low temperature is disadvantageous, because the capture efficiency thereof is extremely deteriorated. Therefore, it is required that the epoxy compound added has a relatively large molecular weight so as to minimize the volatilization thereof. Therefore, as the epoxy compounds, there may be exemplified alicyclic epoxy compounds such as 3,4-epoxycyclohexylmethyl-3,4-epoxycyclohexyl carboxylate, 3,4-epoxy-6-methylcyclohexylmethyl-3,4-epoxy-6-methylcyclohexyl carboxylate, 2,3-epoxycyclohexylmethyl-3,4-epoxycyclohexyl carboxylate, 4-(3,4-epoxy-5-methylcyclohexyl)butyl ester of 3,4-epoxy cyclohexane carboxylic acid or 3,4-epoxycyclohexyl ethylene oxide; aromatic epoxy compounds such as bisphenol A-diglycidyl ether or diglycidyl ester of phthalic acid; aliphatic compounds such as butadiene diepoxide; aliphatic bis (epoxyether) compounds such as butane diol (bis-glycidyl ether); or the like. Among these compounds, alicyclic epoxy compounds such as 3,4-epoxycyclohexylmethyl-3,4-epoxycyclohexyl carboxylate, are preferred.

Production of Polycarbonate Resin Composition

The polycarbonate resin composition as a base material of the precision product container, in which the amount of volatile chlorine is little, can be produced by adding the epoxy compound to the polycarbonate resin in an amount corresponding to that of the volatile chlorine, and melt-kneading the obtained mixture. At this time, although an equivalent amount of chlorine contained in the polycarbonate resin has a certain relationship with the amount of volatile chlorine therefrom, the amount of the volatile chlorine itself is not identical to the whole amount of chlorine contained in the polycarbonate resin. Namely, the amount of chlorine actually reacted with the epoxy compound depends upon the reaction efficiency of ensuring the reaction of the epoxy compound with chlorine in the polycarbonate resin. Since the amount of the volatile chlorine is extremely small, it is considered that even though the epoxy compound is used in an amount equivalent to that of the volatile chlorine, the reaction between the epoxy compound and the halogen cannot be sufficiently completed. Therefore, it is required that an equivalent amount of the epoxy compound added is usually about 100 to about 300 times that of the volatile chlorine. More specifically, the amount of the epoxy compound added is usually 1 ppm to 1% by weight. In the case where the amount of the volatile chlorine generated from the polycarbonate resin is low (not more than 30 ppb), the amount of the epoxy compound added is usually 1 ppm to 1,000 ppm, preferably 1 ppm to 100 ppm, more preferably 1 ppm to 50 ppm. Also, in the case where the amount of the volatile chlorine from the polycarbonate resin is not more than 20 ppb, the amount of the epoxy compound used is 1 ppm to 100 ppm, preferably 1 ppm to 50 ppm. Further, in the case where the amount of the volatile chlorine generated from the polycarbonate resin is not more than 15 ppb, it is sufficient that the amount of the epoxy compound added is 1 ppm to 50 ppm. When the amount of the epoxy compound added is too small, the epoxy group may be disadvantageously consumed without sufficiently reacting with the halogen. On the other hand, when the amount of the epoxy compound added is too large, there may arise such an unsuitable phenomenon that the epoxy compound is volatilized and incorporated into the precision product container as organic impurities, resulting in contamination of the container by such organic impurities.

For example, in the case where the epoxy compound (molecular weight: 252) as shown in Examples hereinafter is added in an amount of 100 ppm to the polycarbonate resin, the molar (or equivalent) amount of the epoxy compound added is:

$$(100 \times 10^{-6})/252 = 0.4 \times 10^{-6} \text{ mol/g}$$

$$(= 0.8 \times 10^{-6} \text{ equivalent/g}).$$

Also, since 100 ppb of the volatile chlorine in the polycarbonate resin corresponds to $(100 \times 10^{-9})/35.5 = 2.8 \times 10^{-9}$ equivalent/g, the amount of the epoxy compound added is about 280 times that of the volatile chlorine. Thus, the amount of the epoxy compound added and actually reacted with chlorine is considerably different from that of the volatile chlorine. In fact, the volatilization of chlorine from the polycarbonate resin cannot be completely prevented unless such an excess amount of the epoxy compound is added. Therefore, it is considered that there exists any problem concerning the reaction efficiency between the epoxy compound and the halogen as described hereinbefore.

Further, various additives such as stabilizers, mold-release agents, fire retardants, antistatic agents, fillers, fibers or impact strength-modifying agents may be optionally added in an effective amount to the polycarbonate resin composition obtained by the above-mentioned method of producing the polycarbonate resin containing a less amount of volatile chlorine, during removing the resin from the reactor or before processing the resin.

Thus, there can be obtained a resin composition according to the present invention, which contains chlorine ions volatilized therefrom in an amount of usually not more than 15 ppb.

The polycarbonate resin composition of the present invention, may further contain various other resins in the form of a blend or an alloy as long as the amount of the polycarbonate resin is more than 50% by weight based on the weight of the blend or alloy. As the other resins used in the blend or alloy, there may be exemplified ABS-based resins (for improving a moldability, i.e., imparting a good flowability thereto so as to remove distortion of a large-scale molded product), polyester-based resins (for improving a solvent resistance), polymethyl methacrylate (PMMA: for improving a gloss), polyamide resins (for improving a solvent resistance), fluorocarbon resins (for improving a wear resistance), polyethylene-based resins (for improving an impact resistance), polyester carbonates (PEC: for improving an impact resistance and a transparency), or the like. As a matter of course, these other resins used may be appropriately selected from those containing a less amount of volatile chlorine.

Further, when the polycarbonate resin solely, or the blend or alloy thereof is used as a base material for an inner layer of containers, these resin compositions can be used in the form of a laminated film with other thermoplastic resins.

Furthermore, the polycarbonate resin composition according to the present invention may optionally contain various additives which can be appropriately selected from reinforcing materials such as talc, mica, clay, potassium titanate whiskers, zinc oxide whiskers or glass fibers; fire retardants such as aluminum hydroxide, magnesium hydroxide or antimony trioxide; magnetic modifying agents such as ferrite or rare cobalt; phenol-based, phosphorus-based or sulfur-based anti-oxidants (or heat stabilizers); benzotriazole-based or benzophenone-based ultraviolet light absorbers; mold-release agents such as carboxylic acid esters or polysiloxane compounds; inorganic or organic pigments such as titanium white, titanium yellow, carbon black or quinacridone-based pigments; perylene-based or perinone-based dyes; antistatic agents such as alkali metal salts or alkaline earth metal salts of glycerol fatty acid monoesters, phosphoric acid diesters or sulfuric acid esters, or mixtures of glycerol fatty acid monoesters or sulfonic acid phosphonium salts with boric acid or boric acid esters; or the like, unless the amount of the volatile chlorine therefrom is disadvantageously increased by the addition of these additives.

The material composed of these polycarbonate resin compositions as a base material can be molded into containers having various shapes by means of an injection-molding method, an extrusion-molding method, a differential pressure-molding method or the like.

As described above, the precision product container of the present invention which is produced by using as a base material, a polycarbonate resin composition containing a less amount of volatile chlorine, can remarkably prevent products contained therein from being contaminated by chlorine.

EXAMPLES

The present invention will now be described in more detail with reference to the following examples, but the present invention is not restricted to those examples and various modifications are possible within the scope of the invention.

Preparation of Phosgene

The liquefied phosgene was treated by passing through a cylindrical container having a diameter of 55 mm and a height of 500 mm, and filled with activated carbon for acidic gases having the following properties (Shirasagi GH2X4/6UG produced by Takeda Co., Ltd.) at a temperature of −5° C., a feed rate of 7.2 kg/hour and a space velocity (SV) of 4.

Properties of Activated Carbon for Acidic Gases

Particle size: 4 to 6 meshes (residue on a 4 mesh sieve, which is passed through a 4 mesh sieve);

True density: 2.1 g/cc;

Percentage of void: 40%;

Specific surface area: 1,200 m$^2$/g;

Pore volume: 0.86 cc/g; and

Average pore diameter: 12 Å.

It was confirmed that by repeatedly passing the liquefied phosgene having $Cl_2$ content as shown in Table 1 through the activated carbon-filled tower, the chlorine content as the value measured at an outlet of the activated carbon tower, could be reduced up to 0 ppm. Incidentally, the liquefied phosgenes having $Cl_2$ contents as shown in Table 1 were respectively prepared by feeding a fresh $Cl_2$ gas from a chlorine bomb into liquefied phosgenes so as to adjust the concentration of $Cl_2$ therein to those shown in Table 1.

Examples 1 to 5

Bisphenol A (BPA), sodium hydroxide (NaOH) and water which were supplied at feed rates of 15.09 kg/hour, 5.49 kg/hour and 93.5 kg/hour, respectively, were dissolved together at 35° C. in the presence of hydrosulfide supplied at a feed rate of 0.017 kg/hour, thereby producing a water phase. The obtained water phase was cooled to 25° C. Separately, methylene chloride as an organic phase was cooled to 5° C. The water phase and the organic phase at a feed rate of 61.9 kg/hour were respectively fed through a Teflon conduit having an inner diameter of 6 mm and an outer diameter of 8 mm, and then introduced into a pipe reactor having an inner diameter of 6 mm and a length of 34 mm, which was connected with the conduits. In the pipe reactor, the water phase and the organic phase were contacted with liquefied phosgene having a $Cl_2$ content as shown in Table 1, which was cooled to 0° C. and separately introduced into the pipe reactor at a feed rate of 7.2 kg/hour.

The above raw materials (bisphenol A and an aqueous sodium hydroxide solution) and the liquefied phosgene were subjected to phosgenation reaction and oligomerization reaction while passing through the pipe reactor at a linear velocity of 1.7 m/sec for 20 seconds. At that time, the reaction temperature reached 60° C. at a top of the reactor in an adiabatic system. The reaction mixture was cooled to 35° C. by an external cooling device before entering into the next oligomerization reaction vessel. Upon the oligomerization, triethylamine as a catalyst and p-tert-butylphenol as a molecular weight-controlling agent were supplied into the oligomerization reaction vessel at feed rates of 0.005 kg/hour and 0.39 kg/hour, respectively.

The oligomerized emulsion thus obtained in the pipe reactor was introduced into a 50 liter-reaction vessel equipped with a stirrer and then stirred at 30° C. under a nitrogen gas atmosphere, thereby proceeding the oligomerization reaction so as to completely consume unreacted sodium salt of bisphenol A (BPA-Na) which still remained in the water phase. Thereafter, the obtained reaction mixture was allowed to stand in order to separate to a water phase and an oil phase, thereby obtaining a methylene chloride solution of the oligomer.

23 kg of the thus obtained methylene chloride solution of the oligomer was charged into a 70 liter-reaction vessel equipped with Pfaudler vanes. 10 kg of methylene chloride as a diluent were added into the reaction vessel, and then 2.2 kg of an aqueous 25 wt. % NaOH solution, 6 kg of water and 2.2 kg of triethylamine were successively added to the resultant methylene chloride solution. The obtained mixture was stirred at 30° C. under a nitrogen gas atmosphere, and subjected to polycondensation reaction for 60 minutes, thereby obtaining a polycarbonate resin.

The obtained reaction solution was mixed with 30 kg of methylene chloride and 7 kg of water, and then stirred for 20 minutes. After stopping the stirring, the reaction solution was separated into a water phase and an organic phase. 20 kg of a 0.1N hydrochloric acid solution was added to the thus separated organic phase, and the mixture was stirred for 15 minutes to extract triethylamine and a small amount of residual alkali components therefrom. After stopping the stirring, the mixture was separated into a water phase and an organic phase. Further, 20 kg of pure water was added to the thus separated organic phase, and the mixture was stirred for 15 minutes. After stopping the stirring, the mixture was separated into a water phase and an organic phase. The above procedure was repeated (three times) until no chlorine ions in the extract were detected.

The obtained purified polycarbonate resin solution was fed into hot water maintained at a temperature of 40° C., powdered and then dried, thereby obtaining a granulated powder (flakes). The obtained flakes were divided into two parts. One part of the flakes was blended with 3,4-epoxy-cyclohexylmethyl-3,4-epoxy-cyclohexyl carboxylate as an epoxy compound in such an amount as shown in Table 1. The mixture was charged into a 30 mmφ twin-screw extruder (manufactured by Ikegai Tekko Co., Ltd.), kneaded at a resin temperature of 290° C. and then extruded into pellets. Simultaneously, in order to determine an amount of volatile chlorine generated from the polycarbonate resin itself, the other part of the flakes was also charged into a 30 mmφ twin-screw extruder (manufactured by Ikegai Tekko Co., Ltd.) without adding any epoxy compound thereto, kneaded at a resin temperature of 290° C. and then extruded into pellets. In the above procedure, careful attention was paid so as to avoid the inclusion of chlorine from outside (e.g., from hands, sweats or cooling water ($H_2O$)).

In order to measure the content of chlorine in phosgene, 70 g of phosgene to be measured was vaporized and absorbed into an aqueous NaOH solution. The solution as NaClO was subjected to oxidation-reduction titration, thereby measuring an absolute amount of chlorine. The measured value was determined as the content of chlorine in the phosgene.

An average molecular weight and a molecular weight distribution of the flakes obtained in each of Examples 1 to 5, amounts of volatile chlorine generated from the above-mentioned two kinds of pellets, an amount of volatile organic substances generated from the pellets to which the epoxy compound is added, and an amount of chlorine volatilized from the molded container were measured. The results are shown in Table 1.

Meanwhile, the respective properties and container shown in Table 1 were evaluated as follows.

(1) Molecular Weight Distribution ($M_w/M_n$)

Using a GPC (Gel Permeation Chromatography) device (tradename "HLC-8020", manufactured by Toso Co., Ltd.)

and tetrahydrofuran as an eluent, the specimen was separated into components by passing through four columns respectively filled with four kinds of fillers for high-speed GPC (tradenames "TSK 5000HLX", "TSK 4000HLX", "TSK 3000HLX" and "TSK 2000HLX", all produced by Toso Co., Ltd.). From the chart obtained by detecting the difference in refractive index between these components, $M_w$ and $M_n$ (calculated as polystyrene) were determined, and the ratio of $M_w/M_n$ was calculated therefrom.

(2) Measurement of Volatile Chlorine 10 g of the obtained pellets were dried so as to adjust the percentage of water absorption thereof to not more than 0.05% by weight. The dried pellets were charged into a glass tube having an inner diameter of 10 mm which was previously washed with ion chromatography-treated water. The glass tube was heat-sealed under vacuum (not more than 1 mmHg) (the sealed tube had a constant length of 20 cm). A whole part of the glass tube was immersed in an oil bath maintained at 280° C. and held therein in an upstanding state for 30 minutes. The glass tube was cooled and washed to remove oil or the like adhered onto the outer surface thereof, and then allowed to stand at room temperature for 3 days.

The sealed glass tube was cut (hot bulb) at the position just above the portion where the polymer was precipitated. The interior of an upper portion of the cut glass tube was washed with 1 ml of pure water, thereby capturing gases therein. The wash water was subjected to an ion chromatography so as to determine the amount of volatile chlorine per one gram of the polymer.

(3) Measurement of Volatile Organic Substances

The pellets to which the epoxy compound was added, were subjected to a head-space gas chromatography at 60° C. for 120 minutes, thereby measuring amounts of components volatilized from the pellets as volatile organic substances, and the amounts of the respective volatile organic substances per unit weight of the pellets were calculated from the measured values. The obtained values were determined as amounts of the volatile organic substances.

(4) Chlorine Generated from Container

The pellets to which the epoxy compound was added, were injection-molded at a cylinder temperature of 290° C. and a metal mold temperature of 80° C. and at a molding cycle of 40 seconds, thereby producing three parts of a container for containing 6-inch$\phi$ semiconductor wafers as shown in FIG. 1, which comprises a casing-like wafer carrier 2 having V-shaped wafer-receiving grooves which comprises twenty six ribs 2a projectingly formed so as to provide the V-shaped grooves 2b capable of arranging therebetween twenty five wafers each having a diameter of 6 inches in juxtaposed relation at 5-mm intervals; a container body 3 for containing the wafers; and a lid 4 detachably mounted onto the container body 3.

Also, a thermoplastic polyester elastomer which were free from generation of detectable chlorine components during the production process, and in raw materials and additives, were injection-molded at a cylinder temperature of 220° C. and a metal mold temperature of 50° C., and at a molding cycle of 40 seconds, thereby producing a wafer retainer 5 inserted into an inside of the lid 4, and a gasket 6 for sealing.

Ten containers thus formed were transferred into a clean room, and respective parts thereof were sufficiently cleaned with pure water containing chlorine ions in an amount of not more than 1 ppb (1 ppb=lower detection limit) when measured by an ion chromatography, in the clean room at room temperature, until the amount of chlorine ions in the cleaning water reaches not more than the lower detection limit of 1 ppb. After cleaning, the respective parts were dried in the clean room at room temperature.

Thereafter, a clean semiconductor wafer having a diameter of 6 inches and a thickness of 400 $\mu$m which was sufficiently cleaned with acid and pure water so as to reduce the chlorine ion content to not more than the lower detection limit of 1 ppb when measured by the method described hereinafter, was inserted into the opposed V-shaped grooves 2', 2' formed at the center of the wafer carrier 2.

Next, the wafer carrier 2 into which the wafer was fitted, was assembled together with the other parts into a container as shown in FIG. 1. Each of the thus assembled containers was contained in an aluminum-laminated bag whose open end was then heat-sealed. The container sealed in the bag was allowed to stand in a clean room at an ordinary temperature for 120 hours. Incidentally, the procedure for fitting wafers into the wafer carrier was conducted in a booth provided in the clean room under a nitrogen gas atmosphere.

After allowing the container sealed in the bag to stand under the above conditions for 120 hours, the aluminum-laminated bag was opened, and then the container was opened to take out the wafer. The surface of the wafer was cleaned with 20 ml of pure water, thereby capturing chlorine ions adhered thereto in the cleaning water. The obtained cleaning water was analyzed by an ion chromatography to measure the amount of chlorine ions contained in the cleaning water. An average of the ten measured values was obtained, and the amount of volatile chlorine based on the weight of the polycarbonate resin was calculated from the average value. The results are shown in Table 1.

As a blank test, a container composed of a wafer carrier 2, a container body 3 and a lid 4 which were made of quartz, was subjected to the same procedure as described above. As a result, the amount of chlorine ions was not more than the lower detection limit of 1 ppb similarly to that measured immediately after cleaning the wafer. When the wafer stored in the container made of quartz for 30 days was processed into an IC chip, it was confirmed that the IC chip was free from errors upon operation.

Comparative Example 1

The same procedure as defined in Example 1 was conducted except that the liquefied phosgene was not passed through the activated carbon-filled tower and no epoxy compound was added. The results are shown in Table 1.

Example 6

The same procedure as defined in Example 1 was conducted except that the liquefied phosgene was not passed through the activated carbon-filled tower and the epoxy compound was added in an amount of 2% by weight. The results are shown in Table 1. In this Example, although the amount of volatile chlorine generated from the polycarbonate resin was maintained at a low level due to the addition of a large amount of the epoxy compound, the amount of volatile organic substances therefrom was increased as compared with those of Examples 1 to 5. Accordingly, the results of this Example were not so good as compared with those of Examples 1 to 5.

TABLE 1

| Examples and Comparative Examples | Cl$_2$ content in phosgene (ppb) | | Average molecular weight of polymer produced (M$_v$) | Molecular weight distribution (M$_w$/M$_n$) | Amount of volatile Cl before addition of epoxy compound (ppb) | Amount of epoxy compound added (ppm) | Amount of volatile Cl after addition of epoxy compound (ppb) | Amount of Cl generated from container (ppb) | Amount of volatile organic substances (ppm) |
|---|---|---|---|---|---|---|---|---|---|
| | Before activated carbon treatment | After activated carbon treatment | | | | | | | |
| Example 1 | 10,000 | 1,000 | 21,000 | 2.83 | 20 | 30 | 5 | 4 | 5 |
| Example 2 | 5,000 | 500 | 21,100 | 2.84 | 18 | 30 | 6 | 4 | 6 |
| Example 3 | 1,000 | 100 | 20,900 | 2.86 | 15 | 30 | 5 | 4 | 4 |
| Example 4 | 10,000 | not treated | 21,300 | 2.80 | 80 | 80 | 5 | 4 | 5 |
| Example 5 | 2,000 | not treated | 21,400 | 2.82 | 50 | 50 | 5 | 4 | 4 |
| Comparative Example 1 | 5,000 | not treated | 21,000 | 2.82 | 80 | 0 | 80 | 55 | 5 |
| Example 6 | 2,000 | not treated | 20,800 | 2.84 | 50 | 20,000 | 5 | 4 | 45 |

What is claimed is:

1. A precision product container comprising a resin composition as a base material, which consists essentially of a polycarbonate resin and at least one epoxy compound, wherein the amount of chlorine volatilized from said polycarbonate resin into a gas phase portion of a glass tube, is not more than 15 ppb when the polycarbonate resin, previously dried until the percentage of water absorption thereof reaches not more than 0.05% by weight, is charged in said glass tube, and the glass tube is sealed under a pressure of not more than 1 mmHg, heated to 280° C. for 30 minutes, cooled to 23° C. and then allowed to stand at an ordinary temperature (23° C.) for 3 days, and the amount of said epoxy compound in said resin composition is 1 ppm to 50 ppm.

2. A precision product container according to claim 1, wherein the resin composition further comprises at least one additive selected from the group consisting of reinforcing materials; fire retardants; magnetic modifying agents; phenol-based, phosphorus-based or sulfur-based antioxidants or heat stabilizers; benzotriazole-based or benzophenone-based ultraviolet light absorbers; mold-release agents; inorganic or organic pigments; perylene-based or perinone-based dyes; and antistatic agents.

* * * * *

UNITED STATES PATENT AND TRADEMARK OFFICE
CERTIFICATE OF CORRECTION

PATENT NO.      : 6,537,627 B2
DATED           : March 25, 2003
INVENTOR(S)     : Kumai et al.

It is certified that error appears in the above-identified patent and that said Letters Patent is hereby corrected as shown below:

<u>Title page,</u>
Item [73], Assignee, please change "Mitisubishi Chemical Corporation" to
-- Mitsubishi Chemical Corporation (JP)
Shin-Etsu Polymer Co., Ltd. (JP) and
Shin-Etsu Handotai Co., Ltd. (JP) --

Signed and Sealed this

Fifteenth Day of July, 2003

JAMES E. ROGAN
*Director of the United States Patent and Trademark Office*